(12) United States Patent
Gekonde et al.

(10) Patent No.: US 9,873,928 B2
(45) Date of Patent: Jan. 23, 2018

(54) HIGH STRENGTH CAST IRON FOR CYLINDER LINERS

(71) Applicant: FEDERAL-MOGUL CORPORATION, Southfield, MI (US)

(72) Inventors: Haron Gekonde, West Bloomfield, MI (US); John Miller, Red Wing, MN (US); Troy Kantola, Whitmore Lake, MI (US); Blair Jenness, Grosse Pointe Park, MI (US); Jeff Hunter, Westland, MI (US)

(73) Assignee: Federal-Mogul, Southfield, MI (US)

(*) Notice: Subject to any disclaimer, the term of this patent is extended or adjusted under 35 U.S.C. 154(b) by 0 days.

(21) Appl. No.: 15/071,114

(22) Filed: Mar. 15, 2016

(65) Prior Publication Data
US 2017/0268082 A1 Sep. 21, 2017

(51) Int. Cl.
| | |
|---|---|
| *F02F 1/00* | (2006.01) |
| *C22C 37/04* | (2006.01) |
| *B22D 19/00* | (2006.01) |
| *C22C 33/08* | (2006.01) |
| *C22C 37/06* | (2006.01) |
| *C22C 37/10* | (2006.01) |

(Continued)

(52) U.S. Cl.
CPC .......... *C22C 37/04* (2013.01); *B22D 19/0009* (2013.01); *C22C 33/08* (2013.01); *C22C 37/00* (2013.01); *C22C 37/06* (2013.01); *C22C 37/10* (2013.01); *F02F 1/004* (2013.01); *F16J 10/00* (2013.01); *F02F 2200/06* (2013.01)

(58) Field of Classification Search
CPC .......... F02F 1/004; C22C 37/04; C22C 33/08; C22C 37/00

USPC ............................................. 123/668, 193.2
See application file for complete search history.

(56) References Cited

U.S. PATENT DOCUMENTS

| | | | |
|---|---|---|---|
| 5,346,561 A | | 9/1994 | Obata et al. |
| 5,860,469 A | * | 1/1999 | Barlow .............. B22D 19/0009 123/193.1 |

(Continued)

FOREIGN PATENT DOCUMENTS

| | | |
|---|---|---|
| CN | 103352163 A | 10/2013 |
| CN | 105369116 A | 3/2016 |

(Continued)

OTHER PUBLICATIONS

International Search Report, dated May 2, 2017 (PCT/US2017/022220).

*Primary Examiner* — Marguerite McMahon
*Assistant Examiner* — James Kim
(74) *Attorney, Agent, or Firm* — Robert L. Stearns; Dickinson Wright, PLLC

(57) ABSTRACT

A cast iron having high strength, hardness, and thermal conductivity for a cylinder liner of an internal combustion engine is provided. The cast iron includes 3.2 wt. % to 3.8 wt. % carbon, 2.2 wt. % to 3.2 wt. % silicon, 0.5 wt. % to 1.3 wt. % copper, and at least 75.0 wt. % iron, based on the total weight of the cast iron. The cast iron further includes 0.01 wt. % to 0.5 wt. % manganese, 0.01 wt. % to 0.2 wt. % chromium, up to 0.3 wt. % phosphorous, up to 0.05 wt. % sulfur, up to 0.2 wt. % tin, and up to 0.1 wt. % magnesium, based on the total weight of the cast iron. Preferably, the cast iron is free of molybdenum, nickel, and vanadium. The cast iron is also heat treated and solidifies to achieve fully spheroidal graphite.

12 Claims, 1 Drawing Sheet

(51) Int. Cl.
*C22C 37/00* (2006.01)
*F16J 10/00* (2006.01)

(56) References Cited

U.S. PATENT DOCUMENTS

| | | | | |
|---|---|---|---|---|
| 5,972,128 | A * | 10/1999 | Miwa | C21D 5/00 |
| | | | | 148/321 |
| 6,508,981 | B1 | 1/2003 | Perrin et al. | |
| 6,553,957 | B1 | 4/2003 | Ishikawa et al. | |
| 6,865,807 | B2 | 3/2005 | Miyamoto et al. | |
| 8,317,942 | B2 | 11/2012 | Pelsoeczy et al. | |
| 8,709,175 | B2 | 4/2014 | Kolodziej et al. | |
| 8,726,974 | B2 | 5/2014 | Barlow et al. | |
| 2005/0194067 | A1* | 9/2005 | Hamano | C22C 38/02 |
| | | | | 148/325 |
| 2008/0053396 | A1* | 3/2008 | Hiraishi | F16J 9/00 |
| | | | | 123/193.2 |
| 2010/0139607 | A1* | 6/2010 | Herbst-Dederichs | C23C 4/02 |
| | | | | 123/193.2 |
| 2010/0326619 | A1* | 12/2010 | Kim | B21J 5/00 |
| | | | | 164/460 |
| 2011/0311391 | A1* | 12/2011 | Pelsoeczy | C22C 38/22 |
| | | | | 420/84 |
| 2012/0152413 | A1 | 6/2012 | Parolini et al. | |
| 2014/0318516 | A1* | 10/2014 | Edmo | C22C 37/04 |
| | | | | 123/668 |
| 2015/0053077 | A1* | 2/2015 | Nam | C22C 37/10 |
| | | | | 92/169.1 |

FOREIGN PATENT DOCUMENTS

| | | |
|---|---|---|
| DE | 4438073 A1 | 5/1996 |
| EP | 0525540 A1 | 2/1993 |
| JP | S5613421 A | 2/1981 |
| JP | H055125 A | 1/1993 |
| JP | H05287438 A | 11/1993 |
| JP | H0617186 A | 1/1994 |
| JP | H0813079 A | 1/1996 |
| JP | H08120396 A | 5/1996 |
| JP | 2000119794 A | 4/2000 |
| JP | 2001227405 A | 8/2001 |
| JP | 2003053509 A | 2/2003 |
| WO | 2013026124 A1 | 2/2013 |

* cited by examiner

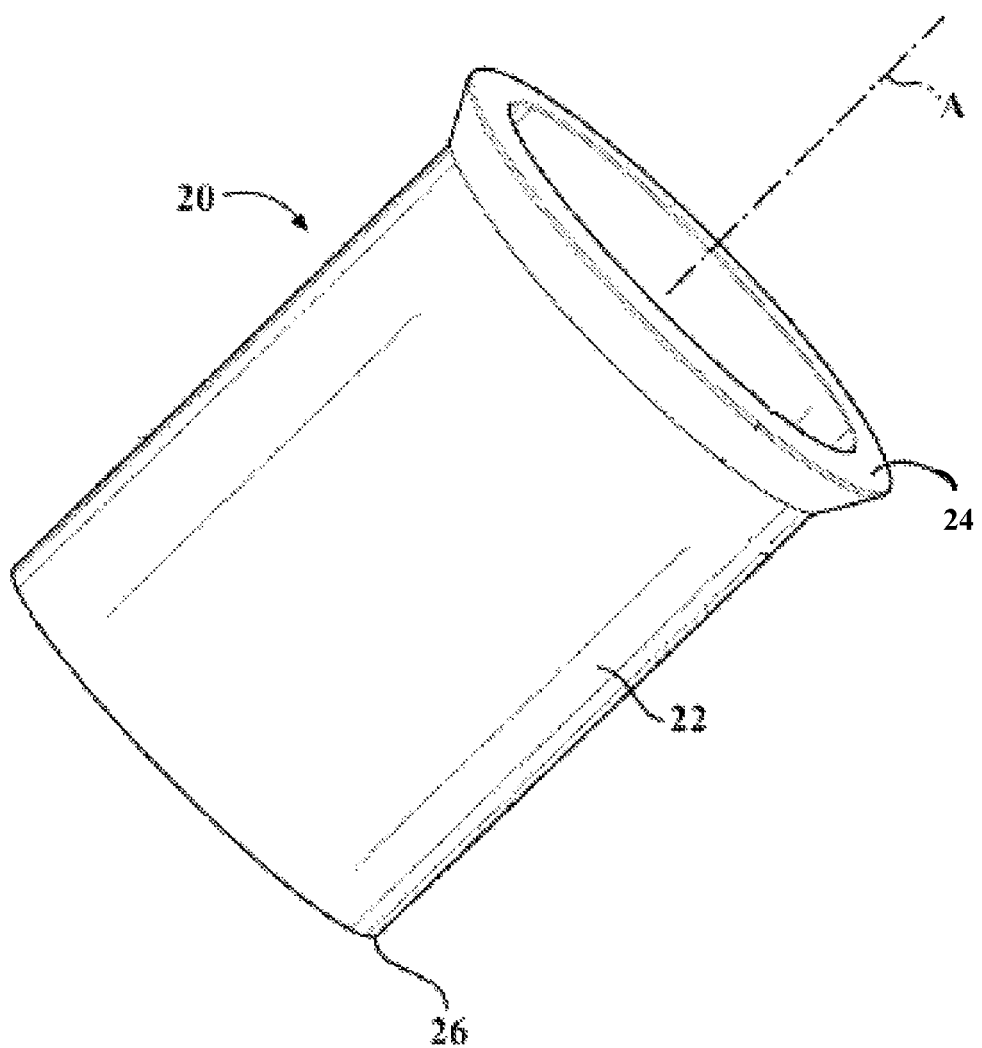

HIGH STRENGTH CAST IRON FOR CYLINDER LINERS

BACKGROUND OF THE INVENTION

1. Field of the Invention

This invention relates generally to cast iron, cylinder liners formed of cast iron, and methods of forming the same.

2. Related Art

Cylinders of internal combustion engines often include a sleeve or liner providing an outer surface and inner surface surrounding a cylindrical area. The cylinder liner can be fitted to the engine block to form the cylinder. The inner surface of the cylinder liner faces toward a piston and provides an interface or sliding surface for the piston rings during a combustion cycle and operation of the internal combustion engine. Due to the harsh conditions of the combustion chamber, the cylinder liner should be formed of a strong, hard, and wear resistant material. The material should be capable of handling the extreme conditions encountered during the combustion cycle, including high temperatures and pressures, to avoid structural problems, such as cracking.

SUMMARY OF THE INVENTION

One aspect of the invention provides a cast iron for a cylinder liner. The cast iron includes 3.2 wt. % to 3.8 wt. % carbon, 2.2 wt. % to 3.2 wt. % silicon, 0.5 wt. % to 1.3 wt. % copper, and at least 75.0 wt. % iron, based on the total weight of the cast iron. The cast iron also includes graphite, wherein at least a portion of the graphite is spheroidal graphite.

Another aspect of the invention provides a cylinder liner formed of cast iron. The cast iron includes 3.2 wt. % to 3.8 wt. % carbon, 2.2 wt. % to 3.2 wt. % silicon, 0.5 wt. % to 1.3 wt. % copper, and at least 75.0 wt. % iron, based on the total weight of the cast iron. The cast iron also includes graphite, wherein at least a portion of the graphite is spheroidal graphite.

Another aspect of the invention provides a method of manufacturing a cast iron for a cylinder liner. The method includes providing an alloy including 3.2 wt. % to 3.8 wt. % carbon, 2.2 wt. % to 3.2 wt. % silicon, 0.5 wt. % to 1.3 wt. % copper, and at least 75.0 wt. % iron, based on the total weight of the alloy. The method further includes melting and solidifying the alloy to form graphite, wherein at least a portion of the graphite formed is spheroidal graphite.

Yet another aspect of the invention provides a method of manufacturing a cylinder liner formed of cast iron. The method includes providing an alloy including 3.2 wt. % to 3.8 wt. % carbon, 2.2 wt. % to 3.2 wt. % silicon, 0.5 wt. % to 1.3 wt. % copper, and at least 75.0 wt. % iron, based on the total weight of the alloy. The method further includes melting and solidifying the alloy to form graphite, wherein at least a portion of the graphite formed is spheroidal graphite.

The cast iron of the present invention provides higher strength than other types of cast iron used to form cylinder liners. The high strength of the cast iron reduces the risk of cracking sometimes caused by high temperatures, pressures, and other harsh conditions of a combustion chamber of an internal combustion engine.

BRIEF DESCRIPTION OF THE DRAWINGS

Other advantages of the present invention will be readily appreciated, as the same becomes better understood by reference to the following detailed description when considered in connection with the accompanying drawing wherein:

FIG. 1 is a perspective view of a cylinder liner formed of cast iron according to an example embodiment of the invention.

DETAILED DESCRIPTION OF EXAMPLE EMBODIMENTS

The invention provides a high strength cast iron, and a cylinder liner 20 of an internal combustion engine formed of the high strength cast iron. An example of the cylinder liner 20 formed of the cast iron is shown in FIG. 1. The cylinder liner 20 is typically disposed in a cylinder block and receives a piston of an internal combustion engine. The cylinder liner 20 extends circumferentially around a center axis A and longitudinally from a first end 24 to an opposite second end 26. The cylinder liner 20 further includes an inner surface 28 facing the center axis A and an outer surface 30 facing opposite the inner surface 28 and away from the center axis A. The inner surface 28 presents an opening having a cylindrical shape. The volume of the opening allows the cylinder liner 20 to receive the piston, such that the piston can reciprocate within the cylinder liner 20 and slide along the inner surface 28 during operating of the internal combustion engine.

The cast iron used to form the cylinder liner 20 is formed by careful choice of alloying elements, while considering cost and a metal treatment process to achieve fully spheroidal graphite. The cast iron has a higher strength compared to other types of cast iron which have been used to form cylinder liners. The cast iron also has a high thermal conductivity and hardness. Thus, the cylinder liner 20 formed of the cast iron is resistant to cracking when exposed to the high temperatures, pressures, and other harsh conditions of the combustion chamber of the internal combustion engine.

The cast iron of the present invention comprises an alloy of carbon, silicon, and iron. In an example embodiment, the cast iron includes 3.2 wt. % to 3.8 wt. % carbon, 2.2 wt. % to 3.2 wt. % silicon, and at least 75.0 wt. % iron, based on the total weight of the cast iron. Typically, the cast iron includes at least 80 wt. % iron. The cast iron is heat treated in a manner which forms graphite in the cast iron. The cast iron is melted and allowed to solidify so that at least a portion of the graphite formed is spheroidal graphite. Preferably the cast iron includes fully spheroidal graphite.

The cast iron of the present invention also includes 0.5 wt. % to 1.3 wt. % copper, based on the total weight of the cast iron. The cast iron can further include up to 0.5 wt. % manganese, up to 0.2 wt. % chromium, up to 0.3 wt. % phosphorous, up to 0.05 wt. % sulfur, up to 0.2 wt. % tin, and up to 0.1 wt. % magnesium, based on the total weight of the cast iron. In the example embodiment, the cast iron includes 0.01 wt. % to 0.5 wt. % manganese and 0.01 wt. % to 0.2 wt. % chromium, based on the total weight of the cast iron.

The copper, manganese, and chromium increase the strength of the cast iron. The elements used to increase strength, including copper, manganese, and chromium, are relatively low cost, compared to other elements which have been used to strengthen other types of cast irons. The copper and chromium are also able to increase the strength of the cast iron without lowering the thermal conductivity. In addition to increasing strength, the chromium can also increase the hardness and thus the wear resistance of the cast iron. Furthermore, the cast iron has a high thermal conductivity and thus is able to quickly dissipate heat generated in the combustion chamber.

Preferably, the cast iron is free of molybdenum, nickel, and vanadium, which increase the cost of the cast iron. In the example embodiment, the cast iron includes not greater than 0.01 wt. % molybdenum, preferably 0.0 wt. % molybdenum, not greater than 0.01 wt. % nickel, preferably 0.0 wt. % nickel, and not greater than 0.01 wt. % vanadium, preferably 0.0 wt. % vanadium, based on the total weight of the cast iron.

The cast iron is produced and treated in a manner which provides fully spheroidal graphite. In the example embodiment, at least a portion of the graphite present in the cast iron is spheroidal graphite, and preferably 100% of the graphite present in the cast iron is spheroidal graphite. In other words, all of the graphite present in the cast iron preferably consists of spheroidal graphite.

Table 1 provides example ranges for the amount of each element used to form the cast iron. The cast irons of Table 1 have a strength ranging from 600 to 900 MPa; fatigue strength ranging from 250 to 380 MPa; a thermal conductivity ranging from 10 to 30 W/mK; and a BHN hardness ranging from 250 to 330.

TABLE 1

| Element | wt. % |
|---------|-------|
| C | 3.2-3.8 |
| Si | 2.2-3.2 |
| Mn | 0.5 max |
| P | 0.3 max |
| S | 0.05 max |
| Cr | 0.2 max |
| Cu | 0.5-1.3 |
| Sn | 0.2 max |
| Mg | 0.1 max |

Another aspect of the invention provides a method of manufacturing the cast iron described above, as well as a method of manufacturing the cylinder liner 20 formed of the cast iron. The method of manufacturing the cast iron includes providing an alloy including 3.2 wt. % to 3.8 wt. % carbon, 2.2 wt. % to 3.2 wt. % silicon, 0.5 wt. % to 1.3 wt. % copper, and at least 75.0 wt. % iron, based on the total weight of the alloy. The alloy provided can also include the other elements described above. In the example embodiment, the alloy includes 0.5 wt. % to 1.3 wt. % copper, 0.01 wt. % to 0.5 wt. % manganese, and 0.01 wt. % to 0.2 wt. % chromium, based on the total weight of the alloy.

The method further includes melting and solidifying the alloy to form graphite, wherein at least a portion of the graphite formed during the solidifying step is spheroidal graphite, preferably fully spheroidal graphite. In other words, 100% of the graphite present in the cast iron is preferably spheroidal graphite, or consists of spheroidal graphite.

Various different heating and treatment techniques can be applied to the alloy to form the cast iron containing spheroidal graphite. In the example embodiment, the heat treatment step first includes heating the alloy to a temperature of about 2800° F. to melt the alloy. The spheroidal graphite is formed during this treatment step. The method further includes allowing the alloy to cool and solidify. The spheroidal graphite is preserved in the cast iron when cooled and solidified.

The method can further include forming the cylinder liner 20 of the improved cast iron. This aspect of the invention typically includes melting the cast iron, and then casting, forging or otherwise shaping the melted cast iron into the desired shape. In the example embodiment, the cylinder liner 20 formed extends circumferentially around the center axis A and longitudinally from the first end 24 to the opposite second end 26. The cylinder liner is also formed to present the inner surface 28 facing the center axis A and the outer surface 30 facing opposite the inner surface 28 and away from the center axis A. The inner surface 28 presents the opening having a cylindrical shape.

Obviously, many modifications and variations of the present invention are possible in light of the above teachings and may be practiced otherwise than as specifically described while within the scope of the appended claims.

What is claimed is:

1. A cast iron for a cylinder liner, comprising:
    3.2 wt. % to 3.8 wt. % carbon, 2.2 wt. % to 3.2 wt. % silicon, 0.5 wt. % to 1.3 wt. % copper, 0.01 wt. % to 0.5 wt. % manganese, 0.01 wt. % to 0.2 wt. % chromium, not greater than 0.01 wt. % molybdenum, not greater than 0.01 wt. % nickel, and not greater than 0.01 wt. % vanadium, and at least 75.0 wt. % iron, based on the total weight of the cast iron;
    the cast iron including graphite, wherein at least a portion of the graphite is spheroidal graphite; and
    the cast iron having a strength ranging from 600 to 900 MPa.

2. The cast iron of claim 1 further including up to 0.3 wt. % phosphorous, up to 0.05 wt. % sulfur, up to 0.2 wt. % tin, and up to 0.1 wt. % magnesium, based on the total weight of the cast iron.

3. The cast iron of claim 1, wherein the graphite consists of spheroidal graphite.

4. The cast iron of claim 1 further including up to 0.3 wt. % phosphorous, up to 0.05 wt. % sulfur, up to 0.2 wt. % tin, up to 0.1 wt. % magnesium, 0.0 wt. % molybdenum, 0.0 wt. % nickel, and 0.0 wt. % vanadium, based on the total weight of the cast iron; and
    wherein 100% of the graphite present in the cast iron is spheroidal graphite.

5. A cylinder liner formed of cast iron, the cast iron comprising:
    3.2 wt. % to 3.8 wt. % carbon, 2.2 wt. % to 3.2 wt. % silicon, 0.5 wt. % to 1.3 wt. % copper, 0.01 wt. % to 0.5 wt. % manganese, 0.01 wt. % to 0.2 wt. % chromium, not greater than 0.01 wt. % molybdenum, not greater than 0.01 wt. % nickel, and not greater than 0.01 wt. % vanadium, and at least 75.0 wt. % iron, based on the total weight of the cast iron;
    the cast iron including graphite, and at least a portion of the graphite is spheroidal graphite; and
    the cast iron having a strength ranging from 600 to 900 MPa.

6. The cylinder liner of claim 5, wherein the cast iron further includes up to 0.3 wt. % phosphorous, up to 0.05 wt. % sulfur, up to 0.2 wt. % tin, and up to 0.1 wt. % magnesium, based on the total weight of the cast iron.

7. The cylinder liner of claim 5, wherein the graphite present in the cast iron consists of spheroidal graphite.

8. The cylinder liner of claim 5, wherein the cast iron forms a body extending circumferentially a center axis and longitudinally between opposite ends;
    the body includes an inner surface facing the center axis and an outer surface facing opposite the inner surface and away from the center axis;
    the inner surface of the body presents an opening having a cylindrical shape; and the cast iron further includes up to 0.3 wt. % phosphorous, up to 0.05 wt. % sulfur, up to 0.2 wt. % tin, up to 0.1 wt. % magnesium, 0.0 wt. % molybdenum, 0.0 wt. % nickel, and 0.0 wt. % vanadium, based on the total weight of the cast iron, and wherein 100% of the graphite present in the cast iron is spheroidal graphite.

9. A method of manufacturing cast iron for a cylinder liner, comprising the steps of:
providing an alloy including 3.2 wt. % to 3.8 wt. % carbon, 2.2 wt. % to 3.2 wt. % silicon, 0.5 wt. % to 1.3 wt. % copper, 0.01 wt. % to 0.5 wt. % manganese, 0.01 wt. % to 0.2 wt. % chromium, not greater than 0.01 wt. % molybdenum, not greater than 0.01 wt. % nickel, and not greater than 0.01 wt. % vanadium, and at least 75.0 wt. % iron, based on the total weight of the alloy; and
melting and solidifying the alloy to form the cast iron including graphite, wherein at least a portion of the graphite formed is spheroidal graphite, and the cast iron having a strength ranging from 600 to 900 MPa.

10. The method of claim 9, wherein the alloy further includes up to 0.3 wt. % phosphorous, up to 0.05 wt. % sulfur, up to 0.2 wt. % tin, and up to 0.1 wt. % magnesium, based on the total weight of the alloy.

11. The method of claim 9, wherein the graphite formed consists of spheroidal graphite.

12. A method of manufacturing a cylinder liner formed of cast iron, comprising the steps of:
providing an alloy including 3.2 wt. % to 3.8 wt. % carbon, 2.2 wt. % to 3.2 wt. % silicon, 0.5 wt. % to 1.3 wt. % copper, 0.01 wt. % to 0.5 wt. % manganese, 0.01 wt. % to 0.2 wt. % chromium, not greater than 0.01 wt. % molybdenum, not greater than 0.01 wt. % nickel, and not greater than 0.01 wt. % vanadium, and at least 75.0 wt. % iron, based on the total weight of the alloy; and
melting and solidifying the alloy to form the cast iron including graphite, wherein at least a portion of the graphite formed is spheroidal graphite, and the cast iron having a strength ranging from 600 to 900 MPa.

* * * * *